(12) United States Patent
Su

(10) Patent No.: US 10,840,097 B2
(45) Date of Patent: Nov. 17, 2020

(54) SEMICONDUCTOR METHODS AND DEVICES

(71) Applicant: Taiwan Semiconductor Manufacturing Company, Ltd., Hsinchu (TW)

(72) Inventor: Yi-Nien Su, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/378,340

(22) Filed: Apr. 8, 2019

(65) Prior Publication Data

US 2019/0237333 A1 Aug. 1, 2019

Related U.S. Application Data

(63) Continuation of application No. 15/867,052, filed on Jan. 10, 2018, now Pat. No. 10,276,381, which is a (Continued)

(51) Int. Cl.
*H01L 21/033* (2006.01)
*H01L 21/311* (2006.01)
*H01L 21/768* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31144* (2013.01); *H01L 21/76811* (2013.01); *H01L 21/76816* (2013.01)

(58) Field of Classification Search
CPC ............... H01L 21/0338; H01L 21/027; H01L 21/76811; H01L 21/76816; H01L 21/31144; H01L 21/0337; H01L 21/0335; H01L 21/0332; H01L 21/76838; H01L 21/3088; H01L 21/76831; H01L 21/76813; H01L 21/31116; H01L 21/0228
See application file for complete search history.

(56) References Cited

U.S. PATENT DOCUMENTS 8,039,179 B2 10/2011 Shieh et al.
8,202,681 B2 6/2012 Lin et al.
(Continued)

FOREIGN PATENT DOCUMENTS

KR 20150045379 A 4/2015
KR 20160015328 A 2/2016

*Primary Examiner* — Nadine G Norton
*Assistant Examiner* — Mahmoud Dahimene
(74) *Attorney, Agent, or Firm* — Slater Matsil, LLP

(57) ABSTRACT

In some embodiments, a method of a semiconductor process includes conformally forming a spacer layer over a plurality of mandrels that are disposed over a mask layer, portions of the spacer layer disposed over opposing sidewalls of adjacent ones of the plurality of mandrels defining trenches therebetween, filling the trenches with a dummy material, and removing first portions of the dummy material in the trenches, thereby forming a plurality of openings in the dummy material. The method further includes filling the plurality of openings with a first material, removing a remaining portion of the dummy material in the trenches, and removing the plurality of mandrels after the removing the dummy material.

21 Claims, 13 Drawing Sheets

Related U.S. Application Data continuation of application No. 15/363,928, filed on Nov. 29, 2016, now Pat. No. 9,881,794.

(56) References Cited

U.S. PATENT DOCUMENTS

| | | |
|---|---|---|
| 8,586,449 B1 | 11/2013 | Chang et al. |
| 8,728,332 B2 | 5/2014 | Lin et al. |
| 8,822,243 B2 | 9/2014 | Yan et al. |
| 9,257,280 B2 | 2/2016 | Ko et al. |
| 9,437,497 B2 | 9/2016 | Shieh et al. |
| 9,484,258 B1 | 11/2016 | Kim et al. |
| 9,899,515 B1 | 2/2018 | Cheng et al. |
| 2006/0091468 A1 | 5/2006 | Liaw |
| 2011/0281208 A1 | 11/2011 | Lin et al. |
| 2012/0043646 A1 | 2/2012 | Kim |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0155171 A1 | 6/2015 | Chang et al. |
| 2015/0243518 A1 | 8/2015 | deVilliers |
| 2016/0035571 A1* | 2/2016 | Chang ................ H01L 21/0338 438/703 |
| 2016/0093502 A1 | 3/2016 | Cheng et al. |
| 2016/0181100 A1 | 6/2016 | deVilliers et al. |
| 2016/0365425 A1* | 12/2016 | Chen ................... H01L 29/6653 |
| 2017/0092506 A1 | 3/2017 | deVilliers |
| 2017/0194146 A1* | 7/2017 | Hsieh ................... H01L 21/0337 |

\* cited by examiner

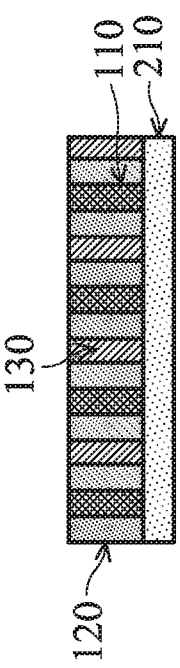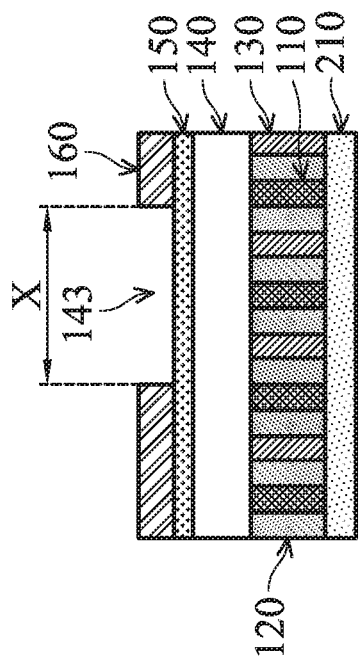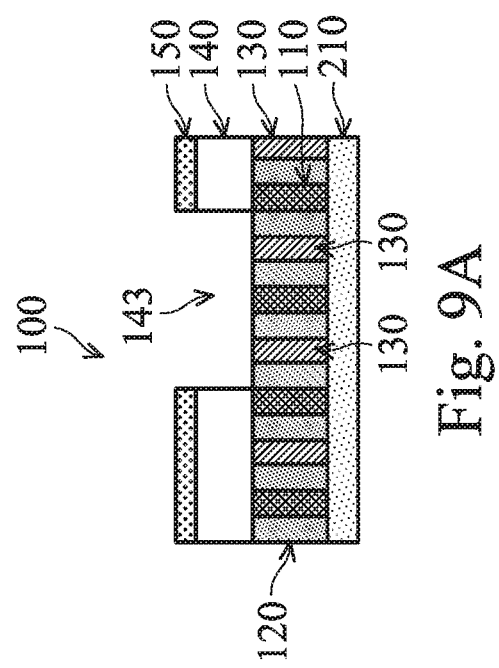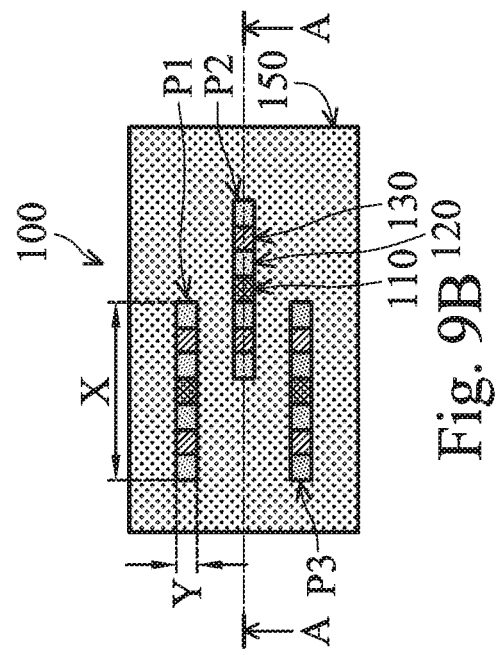
Fig. 7
Fig. 8
Fig. 9A
Fig. 9B

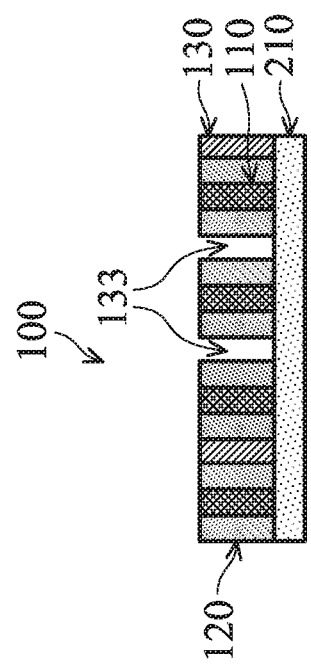
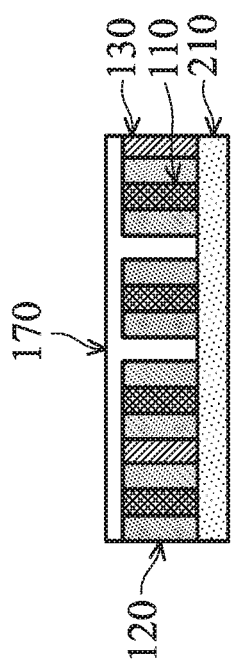
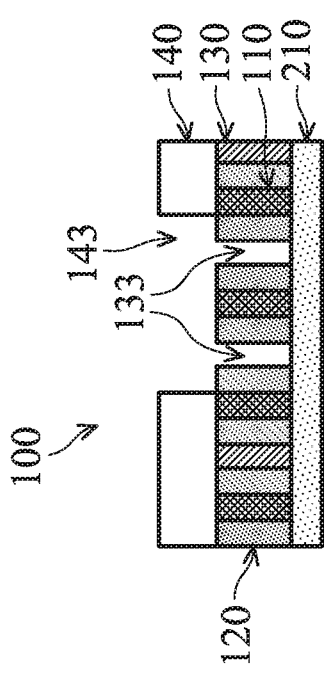
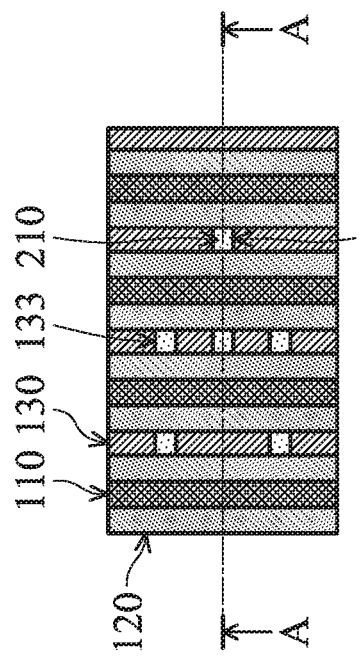

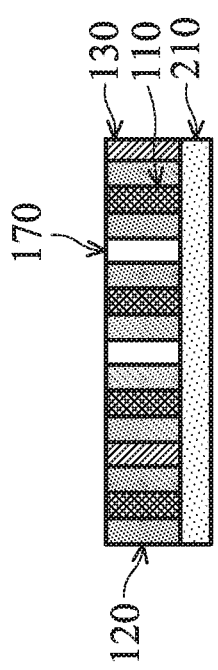
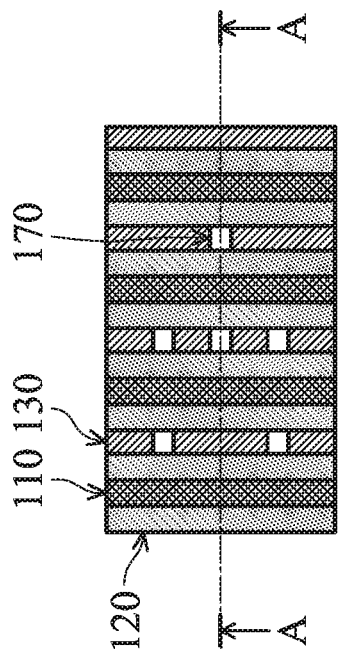
Fig. 13A
Fig. 13B
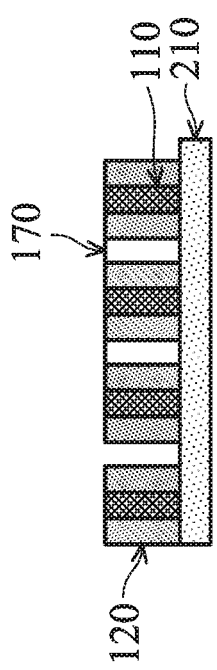
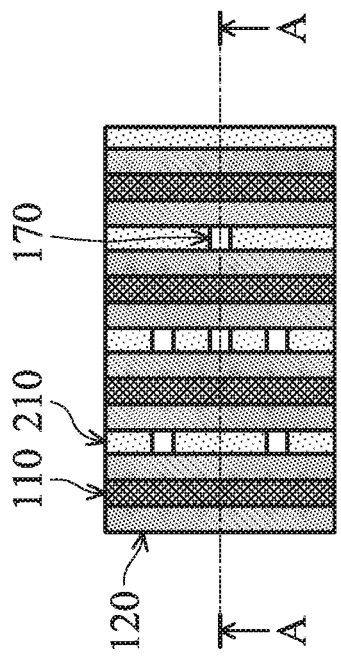
Fig. 14A
Fig. 14B

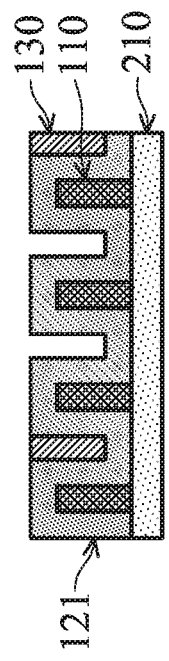
Fig. 25
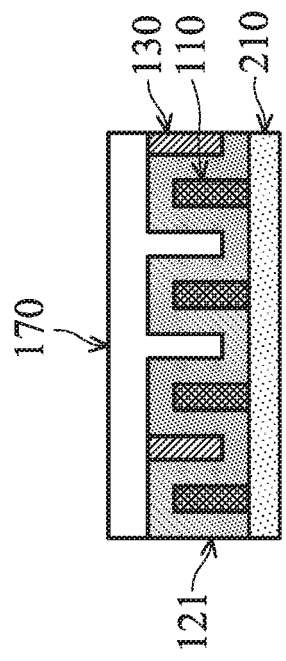
Fig. 26A
Fig. 26B
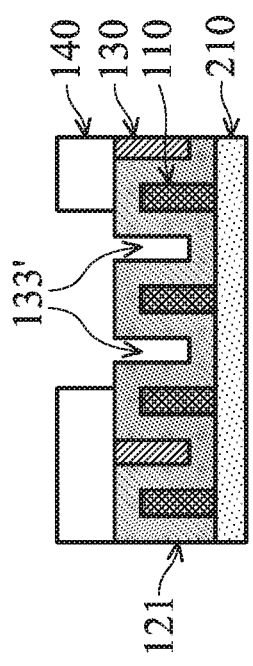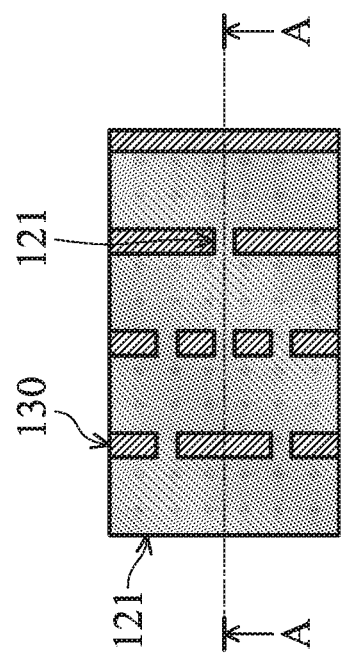
Fig. 27

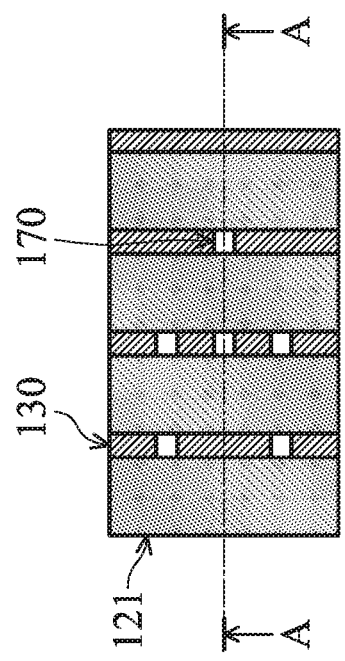
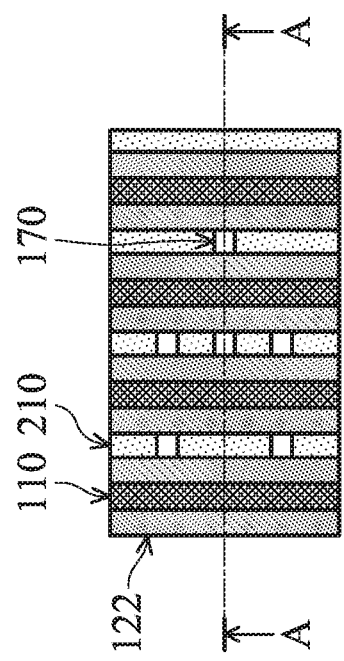
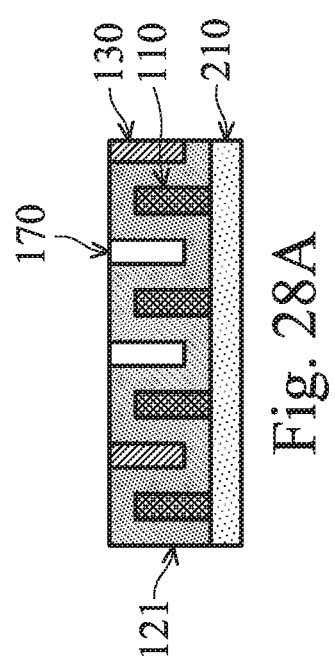
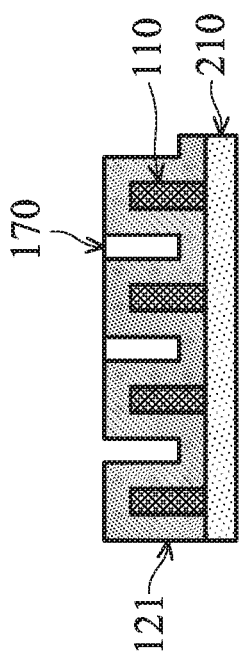
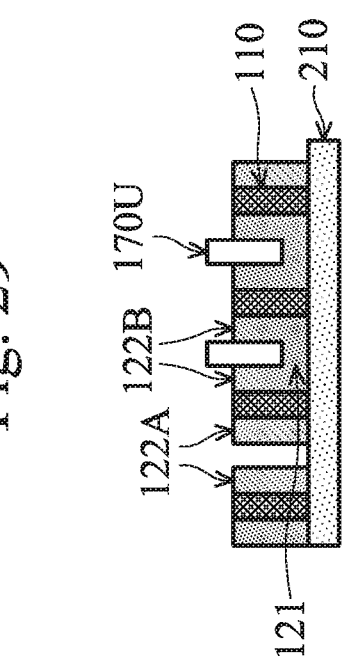

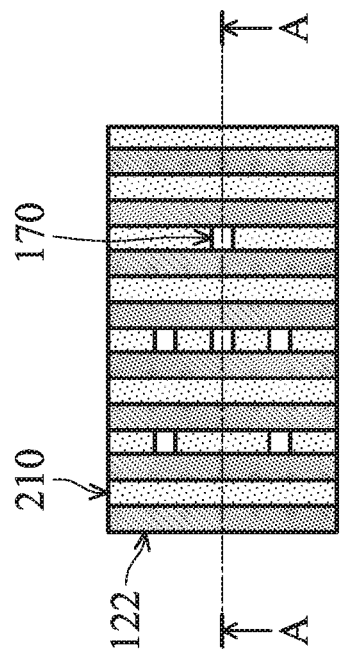
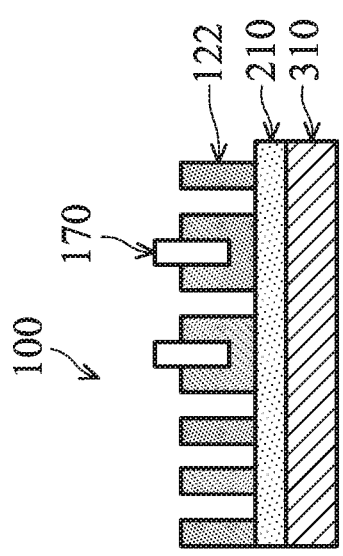
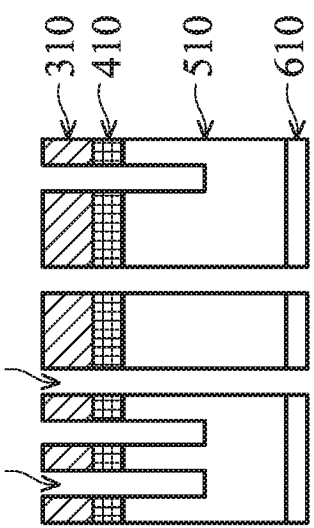
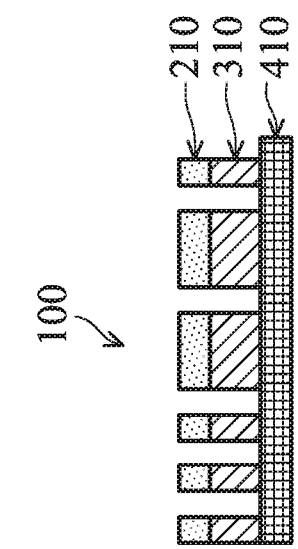
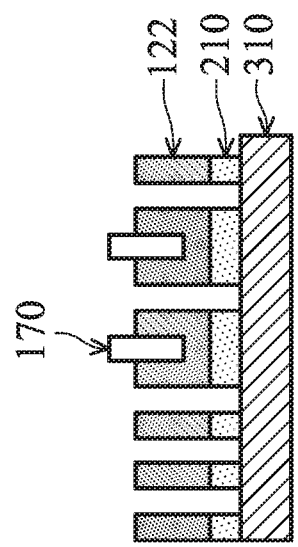

SEMICONDUCTOR METHODS AND DEVICES

PRIORITY CLAIM AND CROSS-REFERENCE

This patent application is a continuation of U.S. patent application Ser. No. 15/867,052, filed on Jan. 10, 2018, and entitled "Semiconductor Methods and Devices," which is a continuation of U.S. patent application Ser. No. 15/363,928, filed on Nov. 29, 2016, and entitled "Semiconductor Methods and Devices," now U.S. Pat. No. 9,881,794, issued on Jan. 30, 2018, which applications are hereby incorporated by reference herein as if reproduced in their entireties.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

As feature size continues to shrink in advanced semiconductor manufacturing process, conventional photolithography may not provide enough resolution for the desired pitch sizes. Multiple-patterning techniques, such as self-aligned double-patterning (SADP) and self-aligned quadruple patterning (SAQP), may be used to pattern mask layers with small pitch sizes. The mask layer patterns defined by multiple-patterning may need to be cut, e.g., when the patterned mask layer are used to form conductive features in subsequent processing. Cut masks are used to form the cut patterns. Challenges exist in the formation of cut masks. There is a need in the art for improved methods of forming cut masks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-18 illustrate cross-sectional views of a semiconductor device at various stages of a semiconductor process, in accordance with an embodiment.

FIGS. 19-34 illustrate cross-sectional views of a semiconductor device at various stages of a semiconductor process, in accordance with another embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to semiconductor processing, and in particular, forming mask layers used for patterning (e.g., generating cut patterns) in advanced semiconductor process nodes (e.g., 24 nm, 14 nm, 10 nm, 7 nm, or beyond).

Figure 1:
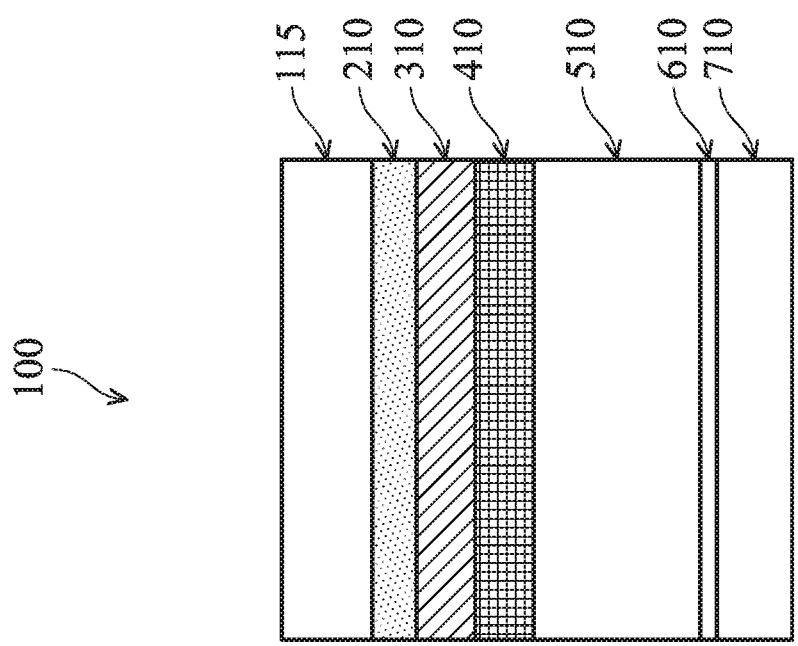
FIG. 1 illustrates a cross-sectional view of a semiconductor device, in accordance with some embodiments.

FIG. 1 illustrates a cross-sectional view of a semiconductor device 100 at a certain stage of a semiconductor process, in accordance with some embodiments. As illustrated by FIG. 1, semiconductor device 100 includes an etch stop layer (ESL) 610 over one or more semiconductor layers 710, a dielectric layer 510 (e.g., a low-K dielectric layer 510) over ESL 610, and three mask layers (e.g., hard mask layers 210, 310 and 410) formed successively over dielectric layer 510. A mandrel layer 115 is formed over hard mask layer 210.

The one or more semiconductor layers 710 may be or include a semiconductor substrate (also referred to as a substrate). The substrate may comprise a crystalline silicon substrate (e.g., wafer), although other suitable elemental semiconductor, such as a suitable compound semiconductor (e.g., gallium arsenide, silicon carbide, indium arsenide, indium phosphide, or the like), or a suitable alloy semiconductor (e.g., silicon germanium carbide, gallium arsenic phosphide, or gallium indium phosphide), or the like, may also be used. Further, the substrate may include an epitaxial layer (epi-layer), may be strained for performance enhancement, and/or may include a silicon-on-insulator (SOI) structure. Electrical devices, such as active devices (e.g., transistors) and/or inactive devices (e.g., resistors, capacitors, diodes, and the like) may be formed in or on the substrate. In addition, the one or more semiconductor layers 710 may include metal layers over the semiconductor substrate and the electrical devices, the metal layers may comprise interconnect structures (e.g., electrically conductive lines and/or vias) that connect the electrical devices to implement certain functions in accordance with the desired design. The processing disclosed in the present disclosure may be used to form conductive features (e.g., conductive lines and/or vias) that connect to the electrical devices and/or interconnect structures in the one or more semiconductor layers 710, as an example. As another example, the one or more semiconductor layers 710 may include semiconductor fin structures (e.g., fin structures of fin field-effect transistors (FinFETs)) formed in a previous patterning process, and the processing disclosed in the present disclosure may be used to form cut patterns for the fin structures.

ESL 610 is formed of a material that has a high etching selectivity relative to the overlying dielectric layer 510, and hence ESL 610 may be used to stop the etching of dielectric layer 510. ESL 610 may include silicon carbide (SiC), silicon nitride (SiN), silicon oxynitride (SiON), silicon carbon-nitride (SiCN), or the like. Dielectric layer 510 may include silicon oxide, silicon nitride, low-K dielectric material having a dielectric constant (k-value) lower than about 3.0, about 2.5, or even lower, or other suitable material.

Hard mask layer 210 comprises SiO, SiN, or a metal oxide such as TiO, ZrO, ZrTiO, in some embodiments, and may have a thickness ranging from about 5 nm to about 22 nm. Hard mask layer 310 comprises TiN or a metal oxide such as TiO, ZrO, ZrTiO, as examples, and may have a thickness ranging from about 5 nm to about 22 nm. Hard mask layer 410 comprises SiO or SiN, and has a thickness ranging from about 5 nm to about 22 nm, in an exemplary embodiment.

Mandrel layer 115 includes silicon such as amorphous-silicon, and may be about 50 nm thick, as an example. Mandrel layer 115 may include SiC or SiOC, and may be formed by a spin-on deposition process or a chemical vapor deposition (CVD) deposition process. as another example. Mandrel layer 115 is patterned to form mandrels 110 in FIG. 3 which will be used in subsequent processing to pattern other underlying layers (e.g., hard mask layers 210), in some embodiments.

Figure 2:
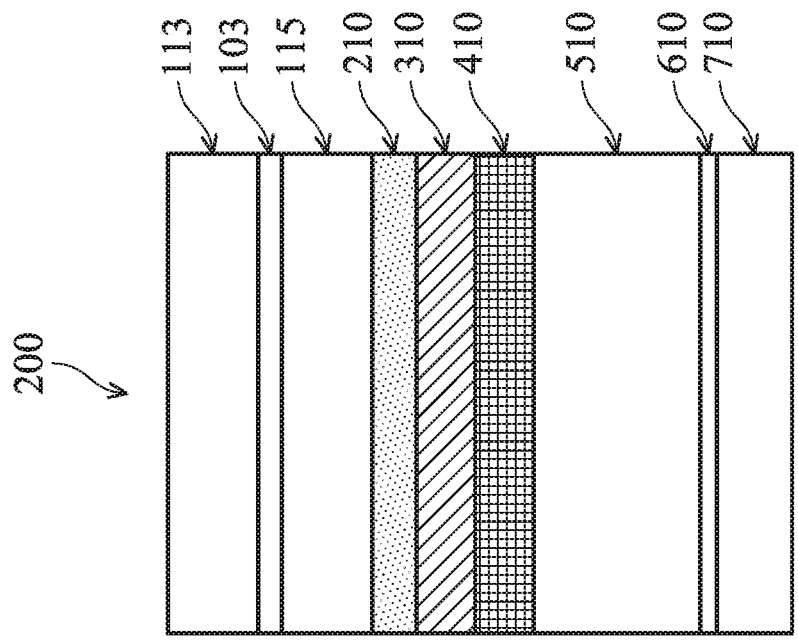
FIG. 2 illustrates a cross-sectional view of another semiconductor device, in accordance with some embodiments.

FIG. 2 illustrates the cross-sectional view of another semiconductor device 200 at a certain stage of a semiconductor process, in accordance with another embodiment. The semiconductor device 200 in FIG. 2 is similar to the semiconductor device 100 in FIG. 1, but with a hard mask layer 103 and a mandrel layer 113 formed successively over mandrel layer 115. Hard mask layer 103 comprises silicon oxide (SiO), SiN, or a metal oxide, such as TiO, ZrO, ZrTiO, in some embodiments. A thickness of hard mask layer 103 may range from about 5 nm to about 22 nm. Mandrel layer 113 may have a similar composition and dimension as mandrel layer 115, although other compositions and dimensions are also possible. Materials and dimensions of other layers of semiconductor device 200 in FIG. 2 may be similar to that of FIG. 1, and, as such, details are not repeated. Skilled artisans will readily appreciate variations and modifications to the semiconductor devices of FIG. 1 and FIG. 2. For example, the number of hard mask layers may be increased or decreased in accordance with factors such as the desired design and process technology. As an example, hard mask layer 210 and hard mask layer 410 in FIGS. 1 and 2 may be omitted.

FIGS. 3-18 illustrate cross-sectional views of a semiconductor device 100 at various stages of a semiconductor process (e.g., a patterning process), in accordance with an embodiment. In FIGS. 3-18, a figure number with a "B" (e.g., FIG. 9B) represents a top view of the semiconductor device, and a figure number with an "A" (e.g., FIG. 9A) represents a cross-sectional view along line A-A of the corresponding top view figure (e.g., FIG. 9B). A figure number (e.g., FIG. 3) without "A" or "B" illustrates the same cross-sectional view as FIG. 9A. Note that for simplicity, not all layers of the semiconductor device 100 are illustrated in all Figures. For example, FIG. 3 only shows mandrels 110 and hard mask layer 210, and other layers underlying hard mask layer 210 are not shown. One of ordinary skill, upon reading the present disclosure, would readily recognize layers of semiconductor device 100 that are omitted from the figures.

Figure 3:
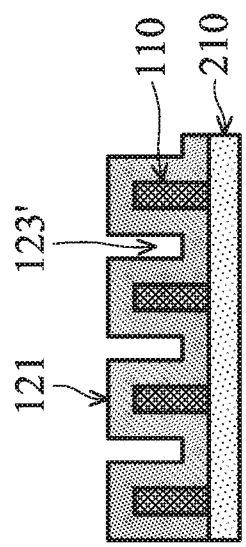

Referring to FIG. 3, a plurality of mandrels 110 are formed over hard mask layer 210 by, e.g., patterning a mandrel layer such as mandrel layer 115 in FIG. 1 or mandrel layer 115 in FIG. 2. For example, mandrel layer 115 in FIG. 1 may be patterned by a photolithography and etching process to form mandrels 110 in FIG. 3. The patterning of mandrel layer 115 may use a dry etch process with an etch process gas including fluorine (F) or chlorine (Cl). In an exemplary embodiment in which mandrel layer 115 comprises silicon, mandrel layer 115 is etched using an etch process gas comprising Cl. In particular embodiments, the etch process gas is a combination of gases and may include $Cl_2$, HBr, $N_2$, $CH_4$, He, and Ar. In another embodiment in which mandrel layer 115 comprises carbon, mandrel layer 115 is etched using an etch process gas comprising F, H, or O. In particular embodiments, the etch process gas may be a combination of gases including $N_2$, $H_2$, $NH_3$, and Ar. An anisotropic plasma etch process may be used to pattern mandrel layer 115. A width W of mandrels 110 may depend on the semiconductor process nodes used. For example, W is about 22 nm for a particular process node, and is about 14 nm for another more advanced process node. A height H of mandrel 110 may be about 50 nm, as an example, although other dimensions are also possible. While FIG. 3 shows only four mandrels 110, it is to be understood that more or less than four mandrels may be formed, depending on the design of the semiconductor device.

The embodiments of the etch process gases described herein are merely examples and are not intended to be limiting. Other suitable etching process gases comprising gas(es) different from the embodiments described herein are also possible, and are fully intended to be included within the scope of the disclosure.

As another example, mandrel layer 115 in FIG. 1 may be patterned by an SADP process to form mandrels 110 illustrated in FIG. 3. An SADP process may be used to form patterns with dimensions smaller than what the conventional photolithography process could achieve. In the SADP process, another mandrel layer (not shown) above mandrel layer 115 in FIG. 1 is first patterned by a photolithography and etching process to form a plurality of mandrels (not shown) that are disposed on a mask layer (not shown) between the another mandrel layer and mandrel layer 115. Next, a spacer layer (not shown) is conformally deposited over the plurality of mandrels and the mask layer. An etching process, such as an anisotropic etching process, is performed to remove portions of the spacer layer disposed on the top surface of the mask layer and the top surfaces of the plurality of mandrels without substantially removing the spacer layer disposed on sidewalls of the plurality of mandrels. A subsequent selective etching process removes the plurality of mandrels. The remaining portions of the spacer layer, which were disposed on sidewalls of the plurality of mandrels before the plurality of mandrels were selectively removed, form a plurality of spacers (not shown) with small pitches (e.g., half of the critical dimension of the semiconductor process node). The patterns of the spacers are transferred to the mask layer overlying mandrel layer 115 (e.g., by an anisotropic etching process), and the patterned mask layer is used to pattern mandrel layer 115 of FIG. 1 to form mandrels 110 in FIG. 3.

In another embodiment, mandrels 110 in FIG. 3 are formed by performing an SAQP process to pattern mandrel layer 115 in FIG. 2. An SAQP process may be implemented by performing the processing in an SADP process twice. For example, for semiconductor device 200 illustrated in FIG. 2, a first SADP process, similar to the SADP process described above for patterning mandrel layer 115 in FIG. 1, is performed to pattern mandrel layer 113 in FIG. 2 to form a plurality mandrels (not shown) over mask layer 103. The plurality of mandrels are used in a second SADP process performed to pattern mandrel layer 115 of FIG. 2, thereby resulting in mandrels 110 shown in FIG. 3. An SAQP process may produce patterns (e.g., mandrels 110) with finer pitches than that of an SADP process.

Figure 4:
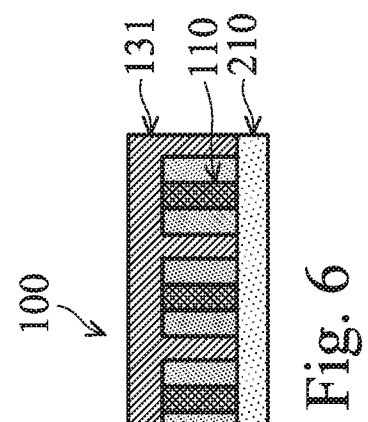

Referring to FIG. 4, a spacer layer 121 is formed over mandrels 110 and hard mask layer 210. Spacer layer 121 comprises SiO, SiN, or a metal oxide (e.g., TiO), in some embodiments. In the illustrated embodiment, spacer layer 121 is conformal, and is formed by a conformal deposition method such as ALD. Other suitable deposition methods, such as chemical vapor deposition (CVD), may also be used. The thickness of spacer layer 121 ranges from about 5 nm to about 22 nm, in an embodiment, although other dimensions are also possible. In another embodiment, the thickness of spacer layer 121 is determined by the semiconductor process nodes used. For example, spacer layer 121 is about 22 nm thick for one semiconductor process node, and is about 14 nm thick for another more advanced semiconductor process node. As illustrated in FIG. 4, trenches 123' (e.g., recesses, openings, or empty spaces) are formed between adjacent mandrels 110 after the deposition of spacer layer 121.

Figure 5:
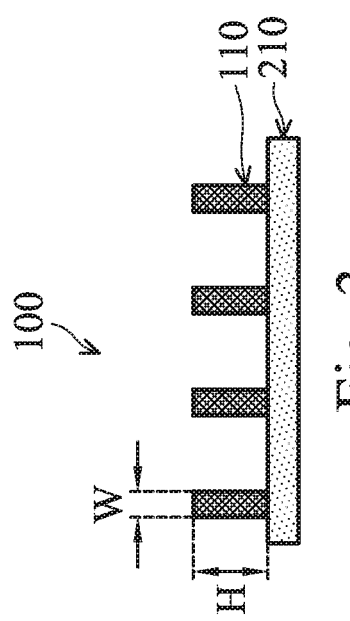

Next, referring to FIG. 5, spacer layer 121 is recessed to expose the upper surfaces of mandrels 110 and the upper surface of hard mask layer 210 using, e.g., a dry etch process such as an anisotropic plasma etch. In embodiments in which spacer layer 121 comprises SiO or SiN, spacer layer 121 is etched by an etch process gas comprising F. In particular embodiments, an etch process gas may be a combination of gases including $CF_4$, $CHF_3$, $CH_3F$, $N_2$, $CH_4$, $O_2$, He, and Ar. In embodiments in which spacer layer 121 comprises an metal oxide (e.g., TiO), spacer layer 121 is etched by an etch process gas comprising Cl. In particular embodiments, an etch process gas may be a combination of gases including $Cl_2$, HBr, $CH_4$, $N_2$, $H_2$, He, Ar, and $O_2$. The anisotropic plasma etch process removes portions of spacer layer 121 disposed over upper surfaces of mandrels 110 and the upper surface of hard mask layer 210, without substantially removing the remaining portions of spacer layers 121 over sidewalls of mandrels 110, as illustrated in FIG. 5. The remaining portions of spacer layer 121 on sidewalls of mandrels 110 are also referred to as spacers 120. The empty spaces between adjacent spacers 120 disposed on opposing sidewalls of adjacent mandrels 110 are referred to as trenches 123.

Figure 6:
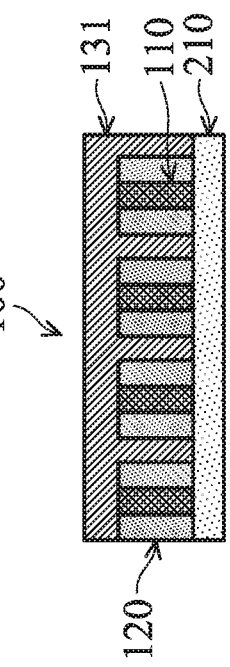

Referring now to FIG. 6, a dummy material 131 (also referred to as a sacrificial material) is formed over spacers 120, mandrels 110 and hard mask layer 210, and fills trenches 123 (illustrated FIG. 5). The portions of dummy material 131 inside trenches 123 are referred to as dummy plugs, portions of which will be replaced by another material in subsequent processing. The dummy material 131 comprises a suitable dielectric material, such as spin-on glass (SOG) (e.g., SiOC), spin-on dielectric (SOD) (e.g., SiO), or spin-on metal oxide (SOM) (e.g., TiO), and are deposited using a spin-on deposition process in some embodiments. In other embodiments, dummy material 131 comprises a flowable oxide (e.g., SiO) that is deposited using a flowable chemical vapor deposition (FCVD) process. Appropriate curing process(es) may follow the deposition process to cure the deposited dummy material 131.

Different regions of the wafer that comprise semiconductor device 100 may have different pattern densities (e.g., densities of mandrels, trenches, etc.). This difference in pattern densities may cause dummy material 131 to have different thicknesses over different regions of the wafer (e.g., due to different amount of dummy material 131 the trenches 123 may hold in different regions of the wafer), thereby resulting in a loading effect. A planarization process, such as a chemical mechanical planarization (CMP) process, may be performed to planarize the upper surface of dummy material 131. In another embodiment, the wafer has a substantially uniform pattern density, therefore there may be little or no loading effect, in which case the planarization process may be omitted.

However, by utilizing the materials disclosed above for dummy material 131, the loading effect may be effectively reduced or eliminated by the CMP process in the presently disclosed method. For example, dummy material 131, once cured, is hard enough and responds well to the CMP process (e.g., yielding a substantially planar upper surface after the CMP process). In contrast, a conventional processing may use spin-on carbon (SOC) to fill trenches 123. Since SOC is relatively soft, the CMP process is not effective in planarizing an uneven upper surface of SOC, thus the conventional processing may not be effective in handling the loading effect.

Referring to FIG. 7, top portions of dummy material 131 are removed to expose upper surfaces of mandrels 110 and upper surfaces of spacers 120. The remaining portions of dummy material 131 inside trenches 123 (see FIG. 5) are also referred to as dummy plugs 130. An etch back process such as a dry etch process may be performed to remove the top portions of dummy material 131, using an etch process gas including F or Cl. In an exemplary embodiment in which dummy material 131 comprises SOG (e.g., SiOC) or SOD (e.g., SiO), dummy material 131 is etched using an etch process gas comprising F. In particular embodiments, SOG is etched using an etch process gas including $CH_3F$, $C_4F_6$, $O_2$, $CF_4$, He, and Ar. In another embodiment in which dummy material 131 comprises SOM (e.g., TiO), dummy material 131 is etched using an etch process gas comprising Cl. In particular embodiments, an etch process gas may be a combination of gases including $Cl_2$, HBr, $CH_4$, $N_2$, He, and Ar. Besides the etch back process disclosed above, other suitable processes, such as CMP, may also be used to remove the top portions of dummy material 131. After the removal of the top portions of dummy material 131, upper surfaces of mandrels 110, upper surfaces of dummy plugs 130, and upper surfaces of spacers 120 are substantially level with each other, as illustrated in FIG. 7.

FIGS. 8-11B illustrate processing steps to remove dummy plugs 130 at first locations (e.g., locations exposed by opening 143 in FIG. 9A, or patterns P1, P2 and P3 in FIG. 9B). In FIG. 8, a first mask layer 140, e.g., a spin-on carbon (SOC) layer comprising carbon (C), and a second mask layer 150, e.g., an SOG layer comprising SiOC, are successively formed over the structure shown in FIG. 7 using suitable formation method such as a spin-on deposition process. In an exemplary embodiment in which the first mask layer 140 is an SOC layer and the second mask layer 150 is an SOG layer, a thickness of SOC layer 140 is in a range from about 40 nm to about 200 nm, and a thickness of SOG layer 150 is in a range from about 10 nm to about 40 nm. Next, a photo resist (PR) 160 is formed over the second mask layer 150 and patterned by, e.g., a lithography process. The patterned PR 160 has an opening 143 with a length X. In some embodiments, length X is about 1 time to about 3 times the thickness of spacers 120, where the thickness of spacers 120 (also referred to as thickness of spacer layer 121) is measured in a direction perpendicular to the sidewalls of mandrels 110.

In FIG. 9A, the pattern (e.g., opening 143) of PR 160 is transferred to the first mask layer 140 (e.g., an SOC layer) and the second mask layer 150 (e.g., an SOG layer) by suitable etching processes, e.g., anisotropic plasma etch processes, and PR 160 is removed by, e.g., an ashing process or a stripping process. In some embodiments in which the second mask layer 150 is an SOG layer, the second mask layer 150 is etched by a plasma process using an etch process gas including F. An etch process gas similar to the etch process gas used for the removal of the top portions of dummy material 131 comprising SOG (described with reference to FIG. 7) may be used. Additionally, in some embodiments in which the first mask layer 140 is an SOC layer, the first mask layer 140 is etched by a plasma process using an etch process gas including $H_2$, $N_2$, $O_2$, $NH_3$, He, and Ar. After first mask layer 140 and second mask layer 150 are etched, opening 143 extends into second mask layer 150 and first mask layer 140, and exposes portions of dummy plugs 130 within the opening 143.

FIG. 9B illustrates the top view of the structure shown in FIG. 9A. As noted above, FIG. 9A corresponds to the cross-sectional view of FIG. 9B along line A-A. Three patterns (e.g., openings) P1, P2 and P3 are illustrated in FIG. 9B, with pattern P2 corresponding to opening 143 shown in FIG. 9A. In the top view, each pattern has the length X (also shown in FIG. 8) and a width Y. While each pattern (e.g., P1, P2 or P3) may have a different length X within the range described above, all patterns (e.g., P1, P2 and P3) may have a same width Y. The width Y may range from about 5 nm to about 50 nm, e.g., 20 nm. In accordance with embodiments of the present disclosure, width Y is equal to the critical dimension (CD) of the semiconductor process node used in fabricating semiconductor device 100. Using the same width Y for all patterns allows for the use of a conformal deposition process such as ALD to fill openings 133 (see FIGS. 11A, 11B and 12) and to achieve a planar upper surface for cut material 170 (see FIG. 12) after the ALD deposition in subsequent processing, as will be described in more detail hereinafter.

Note that patterns P1, P2 and P3 may not be formed at the same time (e.g., in a same processing step or using a same photolithography step). For example, the distance between P2 and P1, and the distance between P2 and P3, may be too small for the resolution of photolithography, thus all three patterns P1, P2 and P3 could not be formed at the same time using one photolithography process. Instead, pattern P2 may be formed in one photolithography process, and patterns P1 and P3 may be formed in another photolithography process. For example, processing steps illustrated in FIGS. 8-11B may be performed for a first iteration to generate pattern P2 and to remove dummy plugs 130 exposed by pattern P2. Then, the processing steps illustrated in FIGS. 8-11B may be performed for a second iteration to generate patterns P1 and P3 and to remove dummy plugs 130 exposed by patterns P1 and P3. Details regarding the removal of dummy plugs 130 exposed by the patterns (e.g., P1, P2, or P3) are described below with reference to FIGS. 10, 11A and 11B. Although FIG. 9B shows three patterns (e.g., P1, P2 and P3), skilled artisans will appreciate that other numbers of patterns and other numbers of iterations are possible, and the pattern(s) generated in each iteration may be adjusted based on, e.g., desired design.

Referring to FIG. 10, second mask layer 150 is removed from semiconductor device 100 (e.g., by an etching process or a CMP process), and an etching process is performed to remove portions of dummy plugs 130 exposed by opening 143 (e.g., see also pattern P2 in FIG. 9B), thus one or more openings 133 are formed at locations where the removed portions of dummy plugs 130 used to be. In some embodiments, dummy plugs 130 exposed by opening 143 are removed by a dry etch process (e.g., a plasma process) using an etch process gas including Cl or F. In an exemplary embodiment in which dummy plugs 130 comprise SOG (e.g., SiOC) or SOD (e.g., SiO), dummy plugs 130 are etched using an etch process gas comprising F. In another embodiment in which dummy plugs 130 comprise SOM (e.g., TiO), dummy plugs 130 are etched using an etch process gas comprising Cl. In the illustrated embodiments, the etch process gas has a high selectivity of dummy plugs 130 to spacers 120 (e.g., selectivity of dummy plugs 130 to spacers 120 is greater than 50), thus the etch process gas removes dummy plugs 130 exposed by opening 143 without substantially attacking spacers 120.

Referring now to FIGS. 11A and 11B, first mask layer 140 is removed by an etching process. A dry etching process using an etch process gas including $H_2$, $N_2$, or $O_2$, may be used to remove first mask layer 140 (e.g., an SOC layer). FIG. 11B illustrates the corresponding top view for FIG. 11A. Note that only the portions of dummy plugs 130 exposed by opening 143 (e.g., pattern P2) are removed in FIG. 10, thus openings 133 are illustrated as small rectangles/squares within the remaining portions of dummy plugs 130. Although openings 133 are illustrated as rectangles or squares in FIG. 11B, the shape of openings 133 may not be perfect rectangles or squares, and openings 133 may have other shapes. In addition, since openings 133 expose the underlying hard mask layer 210 (see FIG. 11A), hard mask layer 210 is visible inside openings 133, as illustrated in the top view of FIG. 11B.

Note that all openings 133 in FIG. 11B may not be formed in a same processing step or iteration, as discussed above with reference to FIG. 9B. For example, openings 133 disposed on line A-A are formed in a first iteration of processing using pattern P2 (see FIG. 9B), where each iteration follows processing steps illustrated in FIGS. 8-11B. Then, in another iteration, other openings 133 (e.g., openings not on line A-A) are formed using patterns P1 and P3 (see FIG. 9B).

Next, referring to FIG. 12, a cut material 170 (also referred to as a first material) is formed over mandrels 110, spacers 120, (the remaining portions of) dummy plugs 130, and hard mask layer 210. Cut material 170 also fills openings 133 generated by the dummy plug removal process described above. Cut material 170 includes SiO, SiN, a metal oxide such as TiO, combinations thereof, or the like, in an exemplary embodiment. A conformal deposition process, such as an ALD process, is used to conformally deposit cut material 170 and to fill openings 133 with cut material 170, in the illustrated embodiment. Recall that during the generation of patterns P1, P2 and P3 (see FIG. 9B), the widths Y of all patterns have a small dimension and may be the same, which is the critical dimension of the semiconductor processing node. Therefore, ALD deposition is able to fill opening 133 and achieve a substantially planar upper surface for cut material 170, as discussed below.

Using ALD to fill openings 133 provides several advantages. Since ALD forms a conformal layer, and since upper surfaces of mandrels 110, upper surfaces of spacers 120 and upper surfaces of dummy plugs 130 are level with each other, the conformally formed cut material 170 also has a planar upper surface over the upper surfaces of mandrels 110, upper surfaces of spacers 120, and upper surfaces of dummy plugs 130, with a small dip (not separately illustrated due to its small nature) in the planarity of the cut material 170 occurring over openings 133. As an example, for openings 133 with a pitch of 40 nm (e.g., measured along a direction perpendicular to line A-A in FIG. 11B), the size of opening 133 (e.g., measured along the direction perpendicular to line A-A in FIG. 11B) may be 20 nm, and cut material 170 with a thickness of about 15 nm may be used to fill opening 133. As another example, for openings 133 with a pitch of 28 nm, the size of opening 133 may be 14 nm, and cut material 170 with a thickness of about 10.5 nm may be used to fill opening 133. After openings 133 are filled with cut material 170 using ALD, cut material 170 may have a planar surface except for a small dip that has a depth of about 50 nm. By having a surface as planar as this, the loading effect problem associated with conventional processing is avoided by using ALD deposition for cut material 170, and no planarization of cut material 170 is needed after the ALD deposition. By using dummy material 131 and cut material 170 in the processing, there is no longer a need for an SOC layer beneath the deposited cut material 170, which relaxes the requirement for a low temperature (e.g., less than about 200° C.) deposition method. This improvement, together with the ALD deposition method used, offers a wider selection of materials for cut material 170, which was not available previously with the conventional method (e.g., using SOC layer beneath cut material 170).

Next, referring to FIG. 13A, top portions of cut material 170 are removed to expose mandrels 110, spacers 120 and dummy plugs 130. The cut material 170 removal process is controlled to stop at the upper surfaces of spacers 120. A dry etching process using an etch process gas including Cl or F may be used. In an exemplary embodiment in which cut material 170 comprises SiO or SiN, cut material 170 is etched using an etch process gas comprising F. In another embodiment in which cut material 170 comprises a metal oxide (e.g., TiO), cut material 170 is etched using an etch process gas comprising Cl. The etch process gas may be the same as the etch process gas used for the removal of the spacer layer 121 comprising the same material, as described with reference to FIG. 5. In some embodiments, the etch process gas has an etching selectivity of cut material 170 to spacers 120 that is more than 10. FIG. 13B illustrates the corresponding top view of FIG. 13A after removal of the top portions of cut material 170. As illustrated in FIG. 13B, portions of dummy plugs 130 at the first locations (e.g., locations corresponding to openings 133 in FIGS. 11A and 11B) are replaced by cut material 170, thus cut material 170 is embedded into dummy plugs 130.

Referring now to FIGS. 14A and 14B, the remaining portions of dummy plugs 130 are removed, and the upper surface of hard mask layer 210 is exposed. A dry etching process using an etch process gas including Cl or F may be used. In an exemplary embodiment in which dummy plugs 130 comprise SOG (e.g., SiOC) or SOD (e.g., SiO), dummy plugs 130 are etched using an etch process gas comprising F. In another embodiment in which dummy plugs 130 comprise SOM (e.g., TiO), dummy plugs 130 are etched using an etch process gas comprising Cl. In the illustrated embodiments, the etch process gas has an etching selectivity of dummy plugs 130 to spacers 120 and cut material 170 that is more than 50. Therefore, the etch process gas removes the remaining portions of dummy plugs 130 without substantially attacking spacers 120 and cut material 170.

Figure 15A:
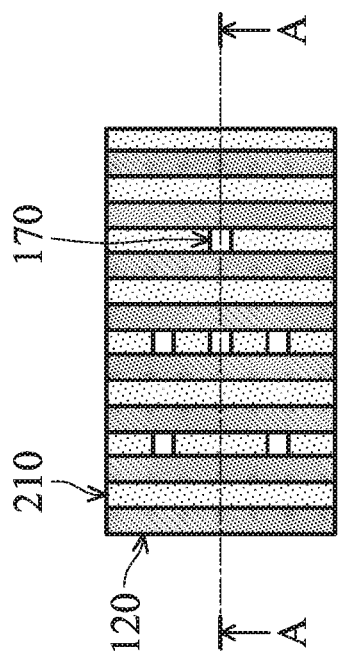
Figure 15B:
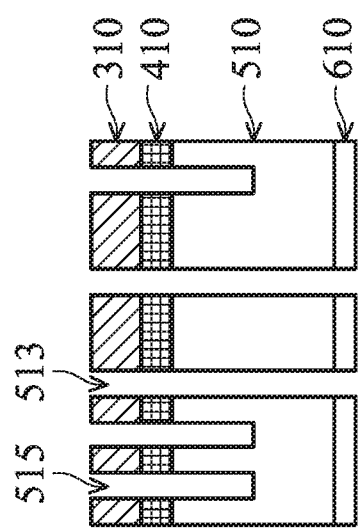

Next, as illustrated in FIGS. 15A and 15B (which additionally illustrates hard mask layer 310), mandrels 110 are removed. After the removal of mandrels 110, spacers 120 and cut material 170 are left over hard mask layer 210. The pattern defined by spacers 120 and cut material 170 will be transferred to hard mask layer 210 and used for etching the underlying layers. In some embodiments, mandrels 110 are removed by a dry etch process using an etch process gas including Cl or F. In an exemplary embodiment in which mandrels 110 comprise silicon, mandrels 110 are etched using an etch process gas comprising Cl. In another embodiment in which mandrels 110 comprise carbon, mandrels 110 are etched using an etching gas comprising F, H, or O. The etch process has a high selectivity of mandrels 110, for example, a selectivity of mandrels 110 to spacers 120 and cut material 170 is more than 50.

Etch selectivity is advantageously used in some of the previous processing steps to remove a target material without attacking other materials, e.g., in the removal of dummy plugs 130 and the removal of mandrels 110. Etch selectivity may be achieved by using different materials for different layers of semiconductor device 100, and using etch process gases that have different etch rates for different materials. In an exemplary embodiment, spacer layer 121 (and spacers 120) comprises a metal oxide (e.g., TiO) and is etched using an etch process gas comprising Cl, dummy material 131 (and dummy plugs 130) comprises SOG (e.g., SiOC) or SOD (e.g., SiO) and is etched using an etch process gas comprising F, cut material 170 comprises SiO or SiN and is etched using an etch process gas comprising F, and mandrels 110 comprise silicon and are etched using an etch process gas comprising Cl. Other combinations of materials and etching process gases are possible, and are fully intended to be included within the scope of the present disclosure.

Figure 16:
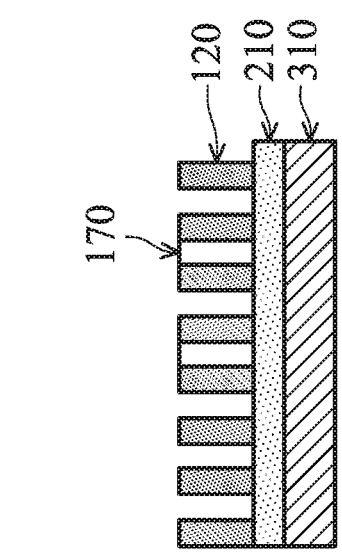

Next, in FIG. 16, the pattern defined by spacers 120 and cut material 170 is transferred to hard mask layer 210. An anisotropic plasma etch may be used to transfer the pattern to hard mask layer 210, although other suitable etching method may also be used. In some embodiments, hard mask layer 210 is etched using an etch process gas comprising F.

Figure 17:
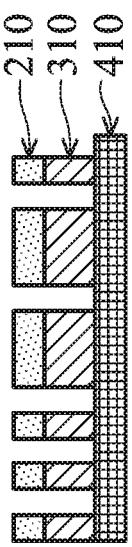

In FIG. 17, spacer layer 120 and cut material 170 are removed by a suitable method such as etching or grinding, and the pattern of hard mask layer 210 is transferred to hard mask layer 310 using a suitable process, e.g., an anisotropic plasma etch process. In some embodiments in which hard mask layer 310 comprises TiN, hard mask layer 310 is etched using an etch process gas comprising Cl. FIG. 17 also illustrates hard mask layer 410 underlying hard mask layer 310, which hard mask layer 410 will be patterned in subsequent processing.

Figure 18:
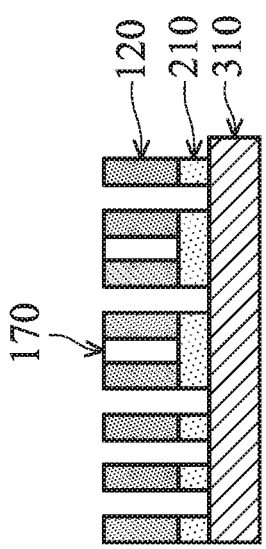
Figure 20:
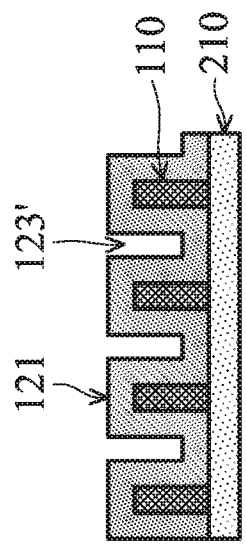

Next, in FIG. 18, hard mask layer 210 is removed by a suitable method (e.g., etching or grinding), and the pattern of hard mask layer 310 is transferred to hard mask layer 410 using, e.g., an anisotropic plasma etch process. In some embodiments in which hard mask layer 410 comprises SiO or SiN, hard mask layer 410 is etched using an etch process gas comprising F. Next, hard mask layer 310 and hard mask layer 410 are used to pattern the underlying dielectric layer 510. An anisotropic etching process, such as a plasma etch process, may be used to pattern dielectric layer 510. After the patterning of dielectric layer 510, openings (e.g., openings 515 and 513) are formed in dielectric layer 510.

The openings 515 and 513 might have different depths, which may be achieved by applying different amount of etching, e.g., in two or more processing steps. For example, a first etch process may be performed to form openings 515 and upper portions (e.g., portions having a same depth in dielectric layer 510 as openings 515) of openings 513. Next, a mask layer (e.g., a PR, not shown) is formed over hard mask layer 310 to cover openings 515 while leaving openings 513 exposed, and subsequently, a second etch process is performed to extend (e.g., deepen) openings 513, e.g., until ESL 610 is exposed, at which point a third etch process may be used to remove portions of ESL 610 exposed by openings 513. As illustrated in FIG. 18, opening 513 extends through dielectric layer 510 and ESL 610, while opening 515 extends into dielectric layer 510 without extending through dielectric layer 510. Skilled artisans will appreciate that the different openings may be used for forming different conductive features (e.g., conductive lines, vias), and additional processing may follow the process illustrated in FIG. 18. For example, openings 515 and 513 may be formed as part of a multi-step dual-damascene process.

FIGS. 19-34 illustrate cross-sectional views of a semiconductor device 100 at various stages of fabrication, in accordance with another embodiment. The processing steps shown in FIGS. 19-34 are similar to the processing steps in FIGS. 3-18, with similar label numbers denoting similar elements, albeit with some differences between the embodiments. The processing steps shown in FIGS. 19-34 are briefly discussed hereinafter, with details of some of the differences between the different embodiments highlighted. One of ordinary skill, upon reading this disclosure, will fully understand the processing steps shown in FIGS. 19-34.

Figure 19:
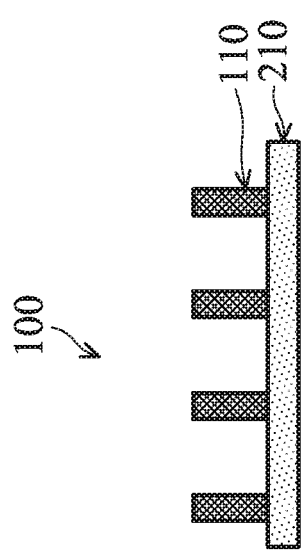
Figure 21:
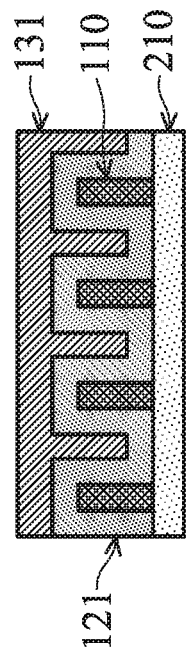
Figure 23:
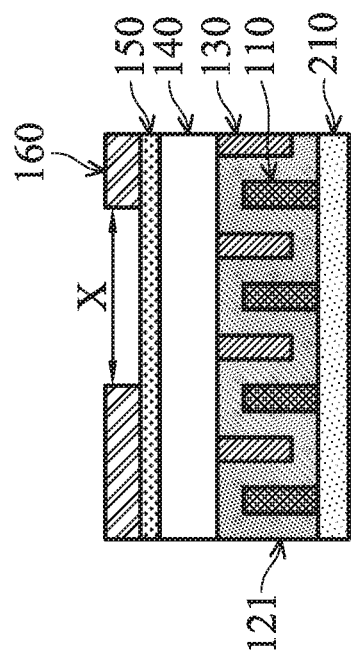
Figure 24B:
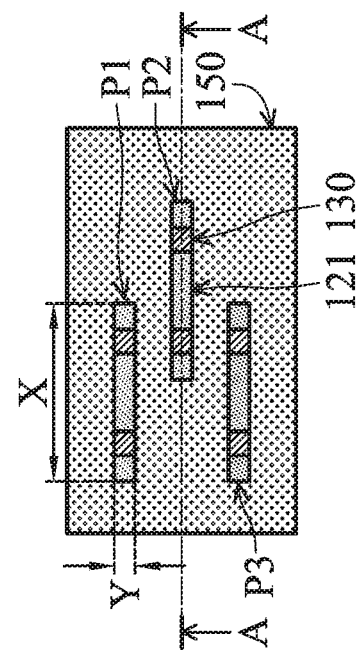

In FIG. 19, mandrels 110 are formed over hard mask layer 210. Spacer layer 121 is deposited conformally over mandrels 110 in FIG. 20, with trenches 123' between adjacent mandrels 110 (also between portions of spacer layer 121 disposed on opposing sidewalls of adjacent mandrels 110). In FIG. 21, dummy material 131 is deposited over spacer layer 121 and fills trenches 123'. Note that in FIG. 21, the deposition of dummy material 131 is performed without the etching of spacer layer 121. In particular, compared with the embodiment shown in FIGS. 3-18, the processing step shown in FIG. 5 is omitted in the current embodiment, thus upper surfaces of mandrel 110 are covered by spacer layer 121 in the subsequent processing steps until the processing step shown in FIG. 30A, where the top portions of spacer layer 121 are removed to expose mandrels 110.

Figure 22:
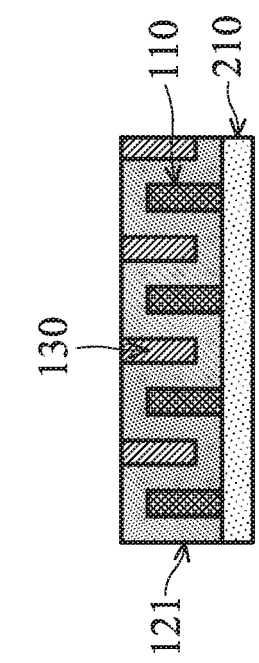
Figure 24A:
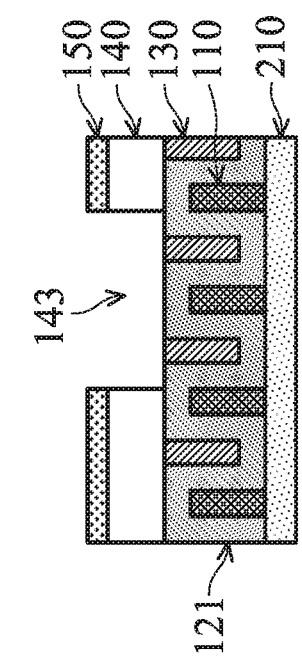

In FIG. 22, the top portions of dummy material 131 is recessed by an etch back process similar to the discussion in FIG. 7, and the remaining portions of dummy material 131 in trenches 123' (see FIG. 20) form a plurality of dummy plugs 130. After recessing the top portions of dummy material 131, a substantially planar upper surface is achieved between spacer layer 121 and dummy plugs 130. An optional planarization process (e.g., a CMP process) may be performed prior to the recessing of dummy material 131, similar to the discussion in FIG. 6.

FIGS. 23-26B illustrate processing steps used to remove portions of dummy plugs 130 at first locations (e.g., locations of opening 133' in FIG. 25). Details are similar to the processing shown in FIGS. 8-11B. Note that compared with openings 133 in FIG. 10, openings 133' do not expose hard mask layer 210 due to the existence of spacer layer 121 at the bottom of openings 133'. Next, as illustrated in FIG. 27, cut material 170 is deposited over spacer layer 121 and fills openings 133' left by the removal of (portions of) dummy plugs 130, similar to the processing of FIG. 12.

FIGS. 28A and 28B illustrate the structure in FIG. 27 after, e.g., etching back of cut material 170. Subsequently, the remaining portions of dummy plugs 130 are removed in FIG. 29. In FIGS. 30A and 30B, spacer layer 121 is recessed to expose mandrels 110 and hard mask layer 210. Recessing of spacer layer 121 may be performed by a dry etch process using an etch process gas including Cl or F. The dry etch gas may have a high etch selectivity of spacer layer 121 to hard mask layer 210 and cut material 170, e.g., an etch selectivity of spacer layer 121 to hard mask layer 210 and cut material 170 is higher than 50. As a result, an upper surface 170U of cut material 170 is higher (e.g., extending further away from hard mask layer 210) than upper surfaces of mandrels 110 and the upper surface of the remaining portions (see label 122A and 122B) of spacer layer 121 after the dry etch process. In other embodiments, the dry etch gas has a high etch selectivity of spacer layer 121 to hard mask layer 210, but has a similar etch selectivity as cut material 170, in which case after the dry etch process, the upper surface 170U of cut material 170 may be level (not shown) with upper surfaces of mandrels 110 and the upper surface of the remaining portions (see label 122A and 122B) of spacer layer 121.

After the recessing of spacer layer 121, the remaining portions of spacer layer 121 on sidewalls of mandrels 110 are referred to as spacers 122 (e.g., spacers 122A and spacers 122B). Spacers 122A are similar to spacers 120 in FIG. 14A, e.g., spacers 122A on opposing sidewalls of mandrels 110 are separate from each other, and there is no spacer layer 121 between a first spacer 122A on a sidewall of a first mandrel 110 and a second spacer 122A on an opposing sidewall of a second mandrel 110. In contrast, spacers 122B on opposing sidewalls of two adjacent mandrels 110 are connected by a remaining portion of spacer layer 121 under cut material 170. Therefore, spacers 122B on opposing sidewalls of two adjacent mandrels 110 and the remaining portion of spacer layer 121 under cut material 170 form a U-shaped structure comprising a same material (e.g., material used for forming spacer layer 121). The U-shaped structure represents portions of spacer layer 121 that extend continuously from a first sidewall of a first mandrel 110 to an opposing sidewall of a second mandrel 110 adjacent the first mandrel.

Next, mandrels 110 are removed, as illustrated in FIGS. 31A and 31B. The spacers 122 and cut material 170 defines a pattern which will be used to pattern the underlying layers.

FIGS. 32 to 34 illustrate the transferring of the pattern defined by spacers 120 and cut material 170 to hard mask layers (e.g., hard mask layers 210, 310 and 410), and the patterning of dielectric layer 510, similar to the processing of FIGS. 16-18.

Figure 36:
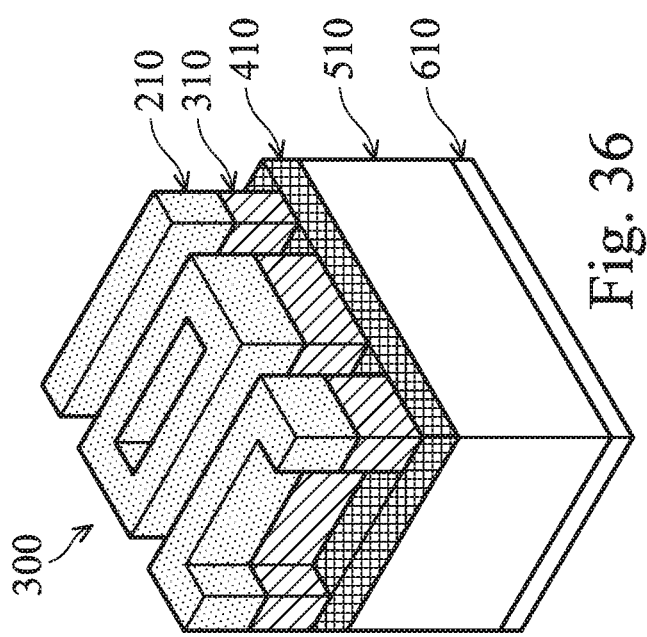
FIGS. 35-37 illustrates perspective views of a semiconductor device at various stages of a semiconductor process, in accordance with yet another embodiment.
Figure 37:
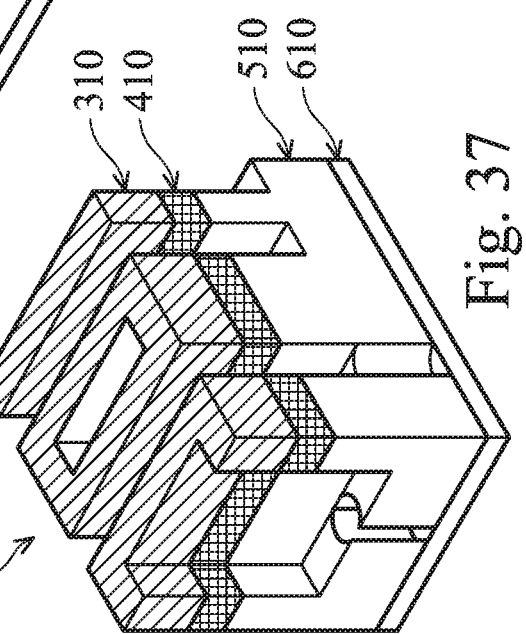
Figure 35:
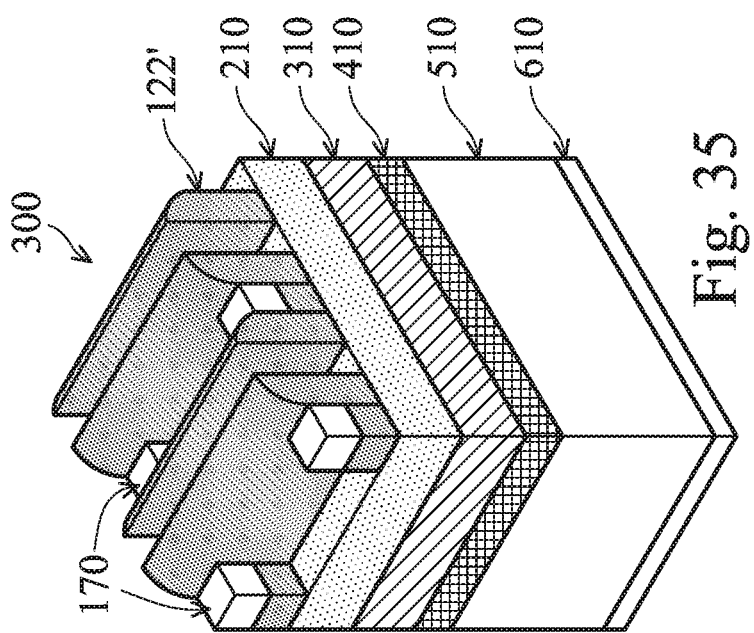

FIGS. 35-37 illustrates perspective views of a semiconductor device 300 at various stages of processing, in accordance with another embodiment of the present disclosure. Semiconductor device 300 is similar to semiconductor device 100, with similar label numbers denote similar elements. In particular, semiconductor device 300 in FIG. 35, FIG. 36, and FIG. 37 are at processing stages similar to the processing stages illustrated in FIGS. 31A/31B, FIG. 33, and FIG. 34, respectively. However, differences exist between semiconductor device 300 and semiconductor device 100. For example, compared with semiconductor device 100 in FIGS. 31A/31B, semiconductor device 300 in FIG. 35 has different patterns defined by cut material 170 and spacer 122'. Additionally, while semiconductor device 100 illustrated in FIGS. 31A/31B may have a planar top surface, spacers 122' in FIG. 35 do not have a planar upper surface.

Figure 38:
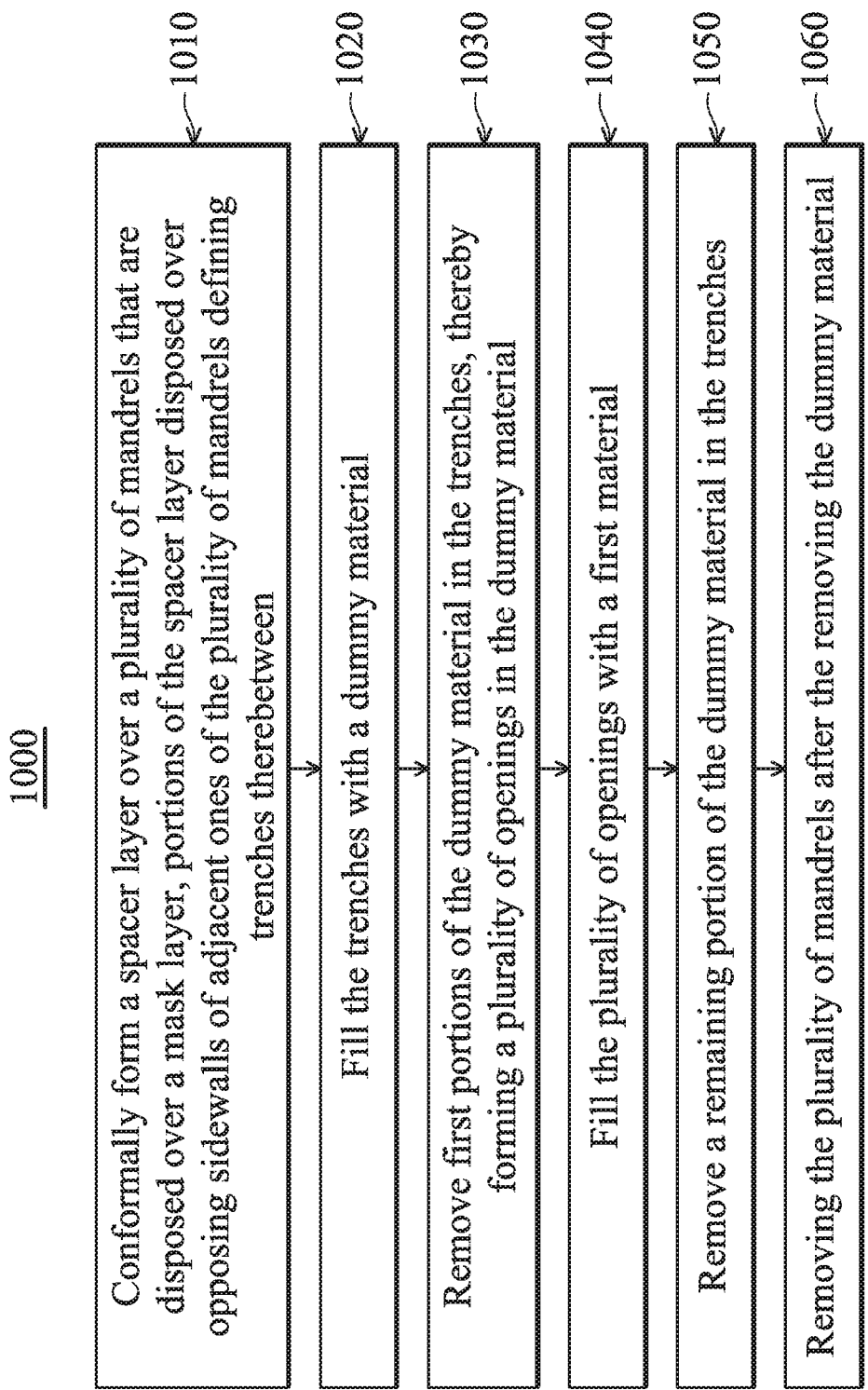
FIG. 38 illustrates a flow diagram of a semiconductor process, in accordance with some embodiments.

FIG. 38 illustrates a flow chart of a semiconductor process 1000, in accordance with some embodiments. It should be understood that the embodiment method shown in FIG. 38 is an example of many possible embodiment methods. One of ordinary skill in the art would recognize many variations, alternatives, and modifications. For example, various steps as illustrated in FIG. 38 may be added, removed, replaced, rearranged and repeated.

Referring to FIG. 38, at step 1010, a spacer layer is conformally formed over a plurality of mandrels that are disposed over a mask layer, portions of the spacer layer disposed over opposing sidewalls of adjacent ones of the plurality of mandrels defining trenches therebetween. At step 1020, the trenches are filled with a dummy material. At step 1030, first portions of the dummy material are removed in the trenches, thereby forming a plurality of openings in the dummy material. At step 1040, the plurality of openings is filled with a first material. At step 1050, a remaining portion of the dummy material is removed in the trenches. At step 1060, the plurality of mandrels are removed after the removing the dummy material.

Embodiments of the methods in the current disclosure have many advantages. For example, by using SOG, SOD or SOM as the dummy material 131, better physical properties (e.g., hardness) are obtained, and CMP may be used to achieve a planar upper surface, thus reducing or solving the loading effect problem. Additionally, by controlling the dimension of width Y in the PR patterns (e.g., patterns P1, P2, P3 in FIG. 9B) to have a fixed dimension (e.g., the critical dimension of the process node), a conformal deposition method such as ALD may be used for forming cut material 170 and filling the openings (e.g., opening 133 in FIG. 10) created by the dummy plug removal process. The ALD method naturally forms a planar upper surface, due to the underlying planar upper surface, thus no planarization process is needed after the deposition of cut material. In addition, the presently disclose methods allows a wider selection of materials for the cut material 170, which was not previously available.

In some embodiments, a method of a semiconductor process includes conformally forming a spacer layer over a plurality of mandrels that are disposed over a mask layer, portions of the spacer layer disposed over opposing sidewalls of adjacent ones of the plurality of mandrels defining trenches therebetween, filling the trenches with a dummy material, and removing first portions of the dummy material in the trenches, thereby forming a plurality of openings in the dummy material. The method further includes filling the plurality of openings with a first material, removing a remaining portion of the dummy material in the trenches, and removing the plurality of mandrels after the removing the dummy material.

In other embodiments, a method of forming a mask pattern includes forming a plurality of mandrels over a mask layer, forming a plurality of spacers over sidewalls of the plurality of mandrels, where spacers on opposing sidewalls of adjacent ones of the plurality of mandrels form trenches in between, and filling the trenches with a sacrificial material. The method further includes replacing a first portion of the sacrificial material with a first material, removing a remaining portion of the sacrificial material, removing the plurality of mandrels, and transferring a first pattern from the spacers and the first material to the mask layer.

In yet another embodiment, a method of semiconductor processing includes conformally forming a spacer layer over a plurality of mandrels disposed on a mask layer, depositing a sacrificial material over the spacer layer and the mask layer using at least in part spin-on deposition or flowable chemical vapor deposition, the sacrificial material comprising silicon oxide carbide, silicon oxide, or a metal oxide, the sacrificial material filling trenches between adjacent ones of the plurality of mandrels, and removing top portions of the sacrificial material to expose an upper surface of the spacer layer. The method also includes performing at least one patterning and etch process to remove a first portion of the sacrificial material, thereby forming openings in the sacrificial material. The performing at least one patterning and etch process includes forming a first etch mask to expose the sacrificial material at first locations, the first etch mask having a first length and a first width, and selectively removing the sacrificial material at the first locations after the forming the first etch mask. The method also includes filling the openings using a first material. The filling the openings includes depositing a first material over the spacer layer and the mask layer using atomic layer deposition, the first material comprising silicon nitride, silicon oxide, or titanium oxide, and removing top portions of the first material to expose an upper surface of a remaining portion of the sacrificial material. The method further includes removing the remaining portion of the sacrificial material, and removing the plurality of mandrels.

In an embodiment, a method includes conformally forming a spacer layer over a plurality of mandrels that are disposed over a mask layer, portions of the spacer layer disposed over opposing sidewalls of adjacent ones of the plurality of mandrels defining trenches therebetween; filling the trenches with a dummy material such that the spacer layer is interposed between the dummy material and the mask layer; removing first portions of the dummy material in the trenches, thereby forming a plurality of openings in the dummy material; filling the plurality of openings with a first material; removing remaining portions of the dummy material in the trenches; after removing the remaining portions of the dummy material, recessing the spacer layer to expose the plurality of mandrels; and removing the plurality of mandrels after recessing the spacer layer.

In an embodiment, a method includes forming a plurality of mandrels over a mask layer; forming a plurality of spacers on sidewalls of the plurality of mandrels, where spacers on opposing sidewalls of adjacent ones of the plurality of mandrels form trenches in between; filling the trenches with a sacrificial material; replacing a first portion of the sacrificial material with a first material, the first material extending from a first spacer on a first sidewall of a first mandrel to an opposing second spacer on a second sidewall of a second mandrel adjacent the first mandrel; removing a remaining portion of the sacrificial material; and removing the plurality of mandrels.

In an embodiment, a method includes conformally forming a spacer layer over a plurality of mandrels disposed on a mask layer; depositing a sacrificial material over the spacer layer and over the mask layer, the sacrificial material filling trenches between adjacent ones of the plurality of mandrels; removing the sacrificial material from an upper surface of the spacer layer; performing an etching process to remove a first portion of the sacrificial material, thereby forming openings in the sacrificial material, where performing the etching process includes: forming a first patterned mask over the sacrificial material and over the spacer layer, the first patterned mask having a first etch pattern with a first length and a first width, the first etch pattern exposing the first portion of the sacrificial material; and selectively removing the first portion of the sacrificial material exposed by the first etch pattern of the first patterned mask. The method further includes filling the openings with a first material, where filling the openings includes: depositing the first material over the spacer layer, over the mask layer, and over a remaining portion of the sacrificial material; and removing a top portion of the first material to expose the remaining portion of the sacrificial material, where after removing the top portion of the first material, an upper surface of a remaining portion of the first material is level with an upper surface of the remaining portion of the sacrificial material.

The method further includes removing the remaining portion of the sacrificial material; and removing the plurality of mandrels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a spacer layer over a plurality of mandrels that are disposed over an upper surface of a mask layer, wherein the spacer layer is formed to extend along sidewalls and upper surfaces of the plurality of mandrels and to extend along the upper surface of the mask layer;
   after forming the spacer layer, filling trenches between the plurality of mandrels with a dummy material such that first portions of the spacer layer along the upper surfaces of the plurality of mandrels are interposed between the plurality of mandrels and the dummy material;
   forming a patterned mask layer over the dummy material, wherein patterns of the patterned mask layer expose first portions of the dummy material in the trenches;
   removing the first portions of the dummy material, thereby forming a plurality of openings in the dummy material;
   filling the plurality of openings with a first material different from the dummy material;
   removing remaining portions of the dummy material in the trenches;
   after removing the remaining portions of the dummy material, recessing the spacer layer to expose the plurality of mandrels, wherein after recessing the spacer layer, an upper surface of the first material distal from the mask layer extends further from the mask layer than an uppermost surface of the spacer layer distal from the mask layer; and
   removing the exposed plurality of mandrels.

2. The method of claim 1, wherein recessing the spacer layer further exposes portions of the mask layer.

3. The method of claim 1, wherein after recessing the spacer layer, first portions of sidewalls of the first material are covered by the spacer layer, and second portions of the sidewalls of the first material are exposed by the spacer layer.

4. The method of claim 1, wherein forming the spacer layer comprises performing a conformal deposition process to form the spacer layer over the plurality of mandrels.

5. The method of claim 1, wherein removing the first portions of the dummy material comprises:
   forming a patterned mask layer over the spacer layer and over the dummy material;
   selectively removing the dummy material exposed by a first pattern of the patterned mask layer; and
   after the selectively removing and before the filling, removing the patterned mask layer to expose an upper surface of the spacer layer.

6. The method of claim 5, wherein the first pattern in the patterned mask layer has a first length and a first width, the first width extending along a direction perpendicular to the first length, the first length and the first width being in a plane parallel to a major upper surface of the mask layer, wherein the first width is a same as a critical dimension of a semiconductor process used to form the first pattern.

7. The method of claim 5, wherein selectively removing the dummy material comprises performing an anisotropic etch process.

8. The method of claim 7, wherein the anisotropic etch process uses an etching gas that is selective to the dummy material.

9. The method of claim 1, wherein filling the plurality of openings comprises performing an atomic layer deposition process to fill the plurality of openings with the first material.

10. The method of claim 1, wherein after removing the remaining portions of the dummy material and before recessing the spacer layer, the first material and the spacer layer have a coplanar upper surface.

11. A method to form a semiconductor device, the method comprising:
    forming a plurality of mandrels over a mask layer;
    forming a plurality of spacers along sidewalls of the plurality of mandrels, wherein spacers on opposing sidewalls of adjacent mandrels define trenches in between;
    filling the trenches with a sacrificial material;
    replacing a first portion of the sacrificial material with a first material, wherein the replacing comprises:
       forming a first patterned mask layer over the sacrificial material, wherein a first Pattern of the first patterned mask layer exposes a first portion of the sacrificial material, wherein the first pattern has a first width and a first length;
       performing a first patterning process to remove the exposed first portion of the sacrificial material to form a first recess in the sacrificial material;
       after the first patterning process, forming a second patterned mask layer over the sacrificial material, wherein a second pattern of the second patterned mask layer exposes a second portion of the sacrificial material, wherein the second pattern has a second width and a second length, wherein the second width and the first width are a same as a critical dimension of a semiconductor process used to form the semiconductor device;
       performing a second patterning process to remove the exposed second portion of the sacrificial material to form a second recess in the sacrificial material; and
       filling the first recess and the second recess with the first material;
    removing a remaining portion of the sacrificial material; and
    removing the plurality of mandrels.

12. The method of claim 11, further comprising, after removing the remaining portion of the sacrificial material and after removing the plurality of mandrels, transferring a pattern defined by the spacers and the first material to the mask layer.

13. The method of claim 11, wherein forming the plurality of spacers comprises:
    depositing a conformal spacer layer over the plurality of mandrels and over the mask layer; and performing an anisotropic etch to remove portions of the conformal spacer layer that are disposed over the mask layer and over upper surfaces of the plurality of mandrels.

14. The method of claim 11, wherein the sacrificial material is silicon oxide carbide, silicon oxide, titanium oxide, or combinations thereof.

15. The method of claim 11, wherein the first length and the second length are different.

16. The method of claim 11, wherein filling the first recess and the second recess comprises filling the first recess and the second recess with the first material using atomic layer deposition.

17. The method of claim 11, wherein the first recess has a third width and a third length, and the second recess has a fourth width and a fourth length, wherein the third width and the fourth width are a same as the first width.

18. The method of claim 17, wherein the third length is different from the fourth length.

19. A method comprising:
conformally forming a spacer layer over a plurality of mandrels disposed on a mask layer;
depositing a sacrificial material over the spacer layer and over the mask layer, the sacrificial material filling trenches between adjacent ones of the plurality of mandrels, wherein first portions of the spacer layer extending along upper surfaces of the plurality of mandrels are interposed between the sacrificial material and the plurality of mandrels;
performing an etching process to remove a first portion of the sacrificial material, thereby forming openings in the sacrificial material, wherein performing the etching process comprises:
forming a first patterned mask over the sacrificial material and over the spacer layer, first openings in the first patterned mask exposing the first portion of the sacrificial material; and
selectively removing the first portion of the sacrificial material exposed by the first openings in the first patterned mask;
filling the openings with a first material, the first material having a different composition than the sacrificial material;
removing a remaining portion of the sacrificial material after filling the openings;
after removing the remaining portion of the sacrificial material, recessing the spacer layer such that the first material extends further from the mask layer than the spacer layer; and
removing the plurality of mandrels.

20. The method of claim 19, wherein filling the openings comprises:
depositing the first material over the spacer layer, over the mask layer, and over the remaining portion of the sacrificial material; and
removing a top portion of the first material to expose the remaining portion of the sacrificial material, wherein after removing the top portion of the first material, an upper surface of a remaining portion of the first material is level with an upper surface of the remaining portion of the sacrificial material.

21. The method of claim 19, wherein after recessing the spacer layer, lower sidewalls of the first material are in contact with the spacer layer, and upper sidewalls of the first material are exposed by the spacer layer.

* * * * *

UNITED STATES PATENT AND TRADEMARK OFFICE
CERTIFICATE OF CORRECTION

PATENT NO.         : 10,840,097 B2
APPLICATION NO.    : 16/378340
DATED              : November 17, 2020
INVENTOR(S)        : Yi-Nien Su Page 1 of 1

It is certified that error appears in the above-identified patent and that said Letters Patent is hereby corrected as shown below:

In the Claims

In Column 16, Line 35, Claim 11, delete "Pattern of the first patterned" and insert --pattern of the first patterned--.

Signed and Sealed this
Ninth Day of February, 2021

Drew Hirshfeld
*Performing the Functions and Duties of the
Under Secretary of Commerce for Intellectual Property and
Director of the United States Patent and Trademark Office*